(12) United States Patent
Shetty et al.

(10) Patent No.: US 10,174,962 B2
(45) Date of Patent: *Jan. 8, 2019

(54) DEVICES, METHODS, AND SYSTEMS FOR OCCUPANCY DETECTION

(71) Applicant: Honeywell International Inc., Morristown, NJ (US)

(72) Inventors: Pradeep Shetty, Bangalore (IN); Wendy Foslien, Woodbury, MN (US); Keith Curtner, Morristown, NJ (US); Prunaprajna R. Mangsuli, Bangalore (IN); Soumitri Kolavennu, Blaine, MN (US)

(73) Assignee: Honeywell International Inc., Morris Plains, NJ (US)

( * ) Notice: Subject to any disclaimer, the term of this patent is extended or adjusted under 35 U.S.C. 154(b) by 328 days.

This patent is subject to a terminal disclaimer.

(21) Appl. No.: 14/879,870

(22) Filed: Oct. 9, 2015

(65) Prior Publication Data

US 2016/0033157 A1 Feb. 4, 2016

Related U.S. Application Data

(63) Continuation of application No. 13/192,096, filed on Jul. 27, 2011, now Pat. No. 9,157,764.

(51) Int. Cl.
*F24F 11/00* (2018.01)
*G01D 4/00* (2006.01)
(Continued)

(52) U.S. Cl.
CPC .......... *F24F 11/0034* (2013.01); *F24F 11/30* (2018.01); *F24F 11/62* (2018.01);
(Continued)

(58) Field of Classification Search
None
See application file for complete search history.

(56) References Cited

U.S. PATENT DOCUMENTS 3,643,183 A 2/1972 Geffe
3,715,693 A 2/1973 Fletcher et al.
(Continued)

FOREIGN PATENT DOCUMENTS

CH 673184 2/1990
DE 3334117 A1 4/1985
(Continued)

OTHER PUBLICATIONS

Alex Beltran, 14, Nov. 5-6, 2014, Memphis, TN, USA, pp. 168-172, Optimal HVAC Building Control with Occupancy Prediction.*
(Continued)

*Primary Examiner* — Tung S Lau
(74) *Attorney, Agent, or Firm* — Seager, Tufte & Wickhem LLP

(57) ABSTRACT

Devices, methods, and systems for occupancy detection are described herein. One device embodiment includes a memory and a processor coupled to the memory. The processor is configured to execute executable instructions stored in the memory to determine energy consumption data associated with a structure at a point in time, and determine whether the structure is occupied at the point in time based, at least in part, on the determined energy consumption data.

16 Claims, 2 Drawing Sheets

(51) Int. Cl.
*G01R 21/133* (2006.01)
*G05B 15/02* (2006.01)
*F24F 11/30* (2018.01)
*F24F 11/62* (2018.01)
*F24F 120/10* (2018.01)
*F24F 140/60* (2018.01)
*F24F 11/64* (2018.01)
*F24F 11/56* (2018.01)

(52) U.S. Cl.
CPC ............ *G01D 4/002* (2013.01); *G01R 21/133* (2013.01); *G05B 15/02* (2013.01); *F24F 11/56* (2018.01); *F24F 11/64* (2018.01); *F24F 2120/10* (2018.01); *F24F 2140/60* (2018.01); *Y02B 90/241* (2013.01); *Y02B 90/245* (2013.01); *Y04S 20/32* (2013.01); *Y04S 20/40* (2013.01)

(56) References Cited

U.S. PATENT DOCUMENTS

| | | | |
|---|---|---|---|
| 3,758,885 | A | 9/1973 | Voorman et al. |
| 4,046,532 | A | 9/1977 | Nelson |
| 4,079,366 | A | 3/1978 | Wong |
| 4,174,807 | A | 11/1979 | Smith et al. |
| 4,206,872 | A | 6/1980 | Levine |
| 4,224,615 | A | 9/1980 | Penz |
| 4,264,034 | A | 4/1981 | Hyltin et al. |
| 4,264,873 | A | 4/1981 | Young |
| 4,298,946 | A | 11/1981 | Hartsell et al. |
| 4,308,991 | A | 1/1982 | Peinetti et al. |
| 4,337,822 | A | 7/1982 | Hyltin et al. |
| 4,341,345 | A | 7/1982 | Hammer et al. |
| 4,345,162 | A | 8/1982 | Hammer et al. |
| 4,382,544 | A | 5/1983 | Stewart |
| 4,386,649 | A | 6/1983 | Hines et al. |
| 4,388,692 | A | 6/1983 | Jones et al. |
| 4,389,577 | A | 6/1983 | Anderson et al. |
| 4,431,134 | A | 2/1984 | Hendricks et al. |
| 4,442,972 | A | 4/1984 | Sahay et al. |
| 4,446,913 | A | 5/1984 | Krocker |
| 4,479,604 | A | 10/1984 | Didner |
| 4,506,827 | A | 3/1985 | Jamieson et al. |
| 4,529,947 | A | 4/1985 | Biard et al. |
| 4,549,169 | A | 10/1985 | Moura et al. |
| 4,550,312 | A | 10/1985 | Galloway et al. |
| 4,577,977 | A | 3/1986 | Pejsa |
| 4,606,401 | A | 8/1986 | Levine et al. |
| 4,614,945 | A | 9/1986 | Brunius et al. |
| 4,621,336 | A | 11/1986 | Brown |
| 4,622,544 | A | 11/1986 | Bially et al. |
| 4,644,320 | A | 2/1987 | Carr et al. |
| 4,717,333 | A | 1/1988 | Carignan |
| 4,725,001 | A | 2/1988 | Carney et al. |
| 4,812,785 | A | 3/1989 | Pauker |
| 4,819,714 | A | 4/1989 | Otsuka et al. |
| 4,837,731 | A | 6/1989 | Levine et al. |
| 4,843,638 | A | 6/1989 | Walters |
| 4,868,795 | A | 9/1989 | Mcdavid et al. |
| 4,881,686 | A | 11/1989 | Mehta |
| 4,918,425 | A | 4/1990 | Greenberg et al. |
| 4,918,439 | A | 4/1990 | Wozniak et al. |
| 4,924,404 | A | 5/1990 | Reinke, Jr. |
| 4,933,668 | A | 6/1990 | Oyet et al. |
| 4,948,040 | A | 8/1990 | Kobayahi et al. |
| 4,968,966 | A | 11/1990 | Jasinski et al. |
| 4,992,779 | A | 2/1991 | Sugino et al. |
| 4,997,029 | A | 3/1991 | Otsuka et al. |
| 4,998,024 | A | 3/1991 | Kirk et al. |
| 5,003,619 | A | 3/1991 | Morris et al. |
| 5,012,973 | A | 5/1991 | Dick et al. |
| 5,038,851 | A | 8/1991 | Mehta |
| 5,053,752 | A | 10/1991 | Epstein et al. |
| 5,063,371 | A | 11/1991 | Oyer et al. |
| 5,065,813 | A | 11/1991 | Berkeley et al. |
| 5,086,385 | A | 1/1992 | Launey et al. |
| 5,088,645 | A | 2/1992 | Bell |
| 5,097,671 | A | 3/1992 | Jeong-Hun |
| 5,140,310 | A | 8/1992 | DeLuca et al. |
| 5,161,606 | A | 11/1992 | Berkeley et al. |
| 5,170,935 | A | 12/1992 | Federspiel et al. |
| 5,181,653 | A | 1/1993 | Foster et al. |
| 5,187,797 | A | 2/1993 | Nielsen et al. |
| 5,230,482 | A | 7/1993 | Ratz et al. |
| 5,238,184 | A | 8/1993 | Adams |
| 5,251,813 | A | 10/1993 | Kniepkamp |
| 5,259,445 | A | 11/1993 | Pratt et al. |
| 5,287,109 | A | 2/1994 | Hesse |
| 5,322,034 | A | 6/1994 | Willham et al. |
| 5,329,991 | A | 7/1994 | Mehta et al. |
| 5,348,078 | A | 9/1994 | Dushane et al. |
| 5,382,948 | A | 1/1995 | Richmond |
| 5,386,577 | A | 1/1995 | Zenda |
| 5,390,206 | A | 2/1995 | Rein et al. |
| 5,392,003 | A | 2/1995 | Nag et al. |
| 5,395,042 | A | 3/1995 | Riley et al. |
| 5,428,388 | A | 6/1995 | Von Bauer et al. |
| 5,428,602 | A | 6/1995 | Kemppainen |
| 5,428,637 | A | 6/1995 | Olivia, Jr. et al. |
| 5,430,409 | A | 7/1995 | Buck et al. |
| 5,438,329 | A | 8/1995 | Gastouniotis et al. |
| 5,451,898 | A | 9/1995 | Johnson |
| 5,465,399 | A | 11/1995 | Oberholtzer et al. |
| 5,481,259 | A | 1/1996 | Bane |
| 5,482,209 | A | 1/1996 | Cochran et al. |
| 5,526,422 | A | 6/1996 | Keen |
| 5,537,106 | A | 7/1996 | Mitsuhashi |
| 5,544,036 | A | 8/1996 | Brown, Jr. et al. |
| 5,566,879 | A | 10/1996 | Longtin |
| 5,570,837 | A | 11/1996 | Brown et al. |
| 5,594,447 | A | 1/1997 | Usui et al. |
| 5,595,342 | A | 1/1997 | McNair et al. |
| 5,598,349 | A | 1/1997 | Elliason et al. |
| 5,613,228 | A | 3/1997 | Tuttle et al. |
| 5,642,071 | A | 6/1997 | Sevenhans et al. |
| 5,659,303 | A | 8/1997 | Adair, Jr. |
| 5,663,774 | A | 9/1997 | Baik |
| 5,673,850 | A | 10/1997 | Uptegraph |
| 5,682,206 | A | 10/1997 | Wehmeyer et al. |
| 5,726,603 | A | 3/1998 | Chawla et al. |
| 5,745,049 | A | 4/1998 | Akiyama et al. |
| 5,745,849 | A | 4/1998 | Britton |
| 5,761,083 | A | 6/1998 | Brown et al. |
| 5,767,664 | A | 6/1998 | Price |
| 5,767,791 | A | 6/1998 | Stoop et al. |
| 5,782,036 | A | 7/1998 | Bertieri et al. |
| 5,782,296 | A | 7/1998 | Mehta |
| 5,809,013 | A | 9/1998 | Kackman |
| 5,818,428 | A | 10/1998 | Eisenbrandt et al. |
| 5,822,544 | A | 10/1998 | Chaco et al. |
| 5,825,327 | A | 10/1998 | Krasner |
| 5,847,623 | A | 12/1998 | Hadjichristos |
| 5,867,763 | A | 2/1999 | Dean et al. |
| 5,873,519 | A | 2/1999 | Beilfuss |
| 5,877,957 | A | 3/1999 | Bennett |
| 5,886,697 | A | 3/1999 | Naughton et al. |
| 5,901,183 | A | 5/1999 | Garin et al. |
| 5,902,183 | A | 5/1999 | D'Souza |
| 5,905,442 | A | 5/1999 | Mosebrook et al. |
| 5,937,942 | A | 8/1999 | Bias et al. |
| 5,947,372 | A | 9/1999 | Tiernan |
| 5,950,709 | A | 9/1999 | Krueger et al. |
| 5,963,650 | A | 10/1999 | Simionescu et al. |
| 5,973,613 | A | 10/1999 | Reis et al. |
| 5,982,445 | A | 11/1999 | Eyer et al. |
| 6,020,881 | A | 2/2000 | Naughton et al. |
| 6,032,867 | A | 3/2000 | Dushane et al. |
| 6,034,603 | A | 3/2000 | Steeves |
| 6,052,600 | A | 4/2000 | Fette et al. |
| 6,058,137 | A | 5/2000 | Partyka |
| 6,059,195 | A | 5/2000 | Adams et al. |
| 6,075,513 | A | 6/2000 | Reddy et al. |
| 6,081,197 | A | 6/2000 | Garrick et al. |

(56) References Cited

U.S. PATENT DOCUMENTS

| | | |
|---|---|---|
| 6,084,530 A | 7/2000 | Pidwerbetsky et al. |
| 6,087,930 A | 7/2000 | Kulka et al. |
| 6,091,715 A | 7/2000 | Vucetic et al. |
| 6,121,875 A | 9/2000 | Hamm et al. |
| 6,140,987 A | 10/2000 | Stein et al. |
| 6,175,860 B1 | 1/2001 | Gaucher |
| 6,192,282 B1 | 2/2001 | Smith et al. |
| 6,196,467 B1 | 3/2001 | Dushane et al. |
| 6,198,394 B1 | 3/2001 | Jacobsen et al. |
| 6,208,331 B1 | 3/2001 | Singh et al. |
| 6,236,326 B1 | 5/2001 | Murphy |
| 6,259,074 B1 | 7/2001 | Brunner et al. |
| 6,259,399 B1 | 7/2001 | Krasner |
| 6,275,166 B1 | 8/2001 | del Castillo et al. |
| 6,285,912 B1 | 9/2001 | Ellison et al. |
| 6,290,140 B1 | 9/2001 | Pesko et al. |
| 6,315,211 B1 | 11/2001 | Sartain et al. |
| 6,318,639 B1 | 11/2001 | Toth |
| 6,330,806 B1 | 12/2001 | Beaverson et al. |
| 6,344,861 B1 | 2/2002 | Naughton et al. |
| 6,351,693 B1 | 2/2002 | Monie et al. |
| 6,353,846 B1 | 3/2002 | Fleeson |
| 6,366,572 B1 | 4/2002 | Esterberg et al. |
| 6,366,622 B1 | 4/2002 | Brown et al. |
| 6,398,118 B1 | 6/2002 | Rosen et al. |
| 6,414,963 B1 | 7/2002 | Gemar |
| 6,453,687 B2 | 9/2002 | Sharood et al. |
| 6,478,233 B1 | 11/2002 | Shah |
| 6,493,643 B1 | 12/2002 | Aisa |
| 6,502,758 B2 | 1/2003 | Cottrell |
| 6,518,957 B1 | 2/2003 | Lehtinen et al. |
| 6,552,525 B2 | 4/2003 | Bessler |
| 6,574,581 B1 | 6/2003 | Bohrer et al. |
| 6,578,770 B1 | 6/2003 | Rosen |
| 6,580,950 B1 | 6/2003 | Johnson et al. |
| 6,581,846 B1 | 6/2003 | Rosen |
| 6,595,430 B1 | 7/2003 | Shah |
| 6,619,555 B2 | 9/2003 | Rosen |
| 6,621,507 B1 | 9/2003 | Shah |
| 6,624,750 B1 | 9/2003 | Marman et al. |
| 6,631,271 B1 | 10/2003 | Logan |
| 6,727,816 B1 | 4/2004 | Helgeson |
| 6,768,901 B1 | 7/2004 | Osborn et al. |
| 6,783,079 B2 | 8/2004 | Carey et al. |
| 6,785,255 B2 | 8/2004 | Sastri et al. |
| 6,786,421 B2 | 9/2004 | Rosen |
| 6,788,271 B1 | 9/2004 | Koo et al. |
| 6,789,739 B2 | 9/2004 | Rosen |
| 6,823,181 B1 | 11/2004 | Kohno et al. |
| 6,824,069 B2 | 11/2004 | Rosen |
| 6,833,990 B2 | 12/2004 | LaCroix et al. |
| 6,836,506 B2 | 12/2004 | Anderson |
| 6,838,978 B2 | 1/2005 | Aizu et al. |
| 6,851,621 B1 | 2/2005 | Wacker et al. |
| 6,891,838 B1 | 5/2005 | Petite et al. |
| 6,901,066 B1 | 5/2005 | Helgeson |
| 6,931,078 B2 | 8/2005 | Mccorkle et al. |
| 6,931,445 B2 | 8/2005 | Davis |
| 6,967,565 B2 | 11/2005 | Lingemann |
| 6,975,958 B2 | 12/2005 | Bohrer et al. |
| 6,987,793 B2 | 1/2006 | Dhar et al. |
| 6,996,402 B2 | 2/2006 | Logan et al. |
| 7,001,495 B2 | 2/2006 | Essalik et al. |
| 7,002,910 B2 | 2/2006 | Garcia-luna-aceves et al. |
| 7,015,789 B1 | 3/2006 | Helgeson |
| 7,050,026 B1 | 5/2006 | Rosen |
| 7,058,524 B2 | 6/2006 | Hayes et al. |
| 7,110,832 B2 | 9/2006 | Ghent |
| 7,146,253 B2 | 12/2006 | Hoog et al. |
| 7,152,806 B1 | 12/2006 | Rosen |
| 7,156,318 B1 | 1/2007 | Rosen |
| 7,181,317 B2 | 2/2007 | Amundson et al. |
| 7,184,524 B2 | 2/2007 | Digate et al. |
| 7,240,289 B2 | 7/2007 | Naughton et al. |
| 7,246,087 B1 | 7/2007 | Ruppelt et al. |
| 7,298,716 B2 | 11/2007 | Abraham et al. |
| 7,302,642 B2 | 11/2007 | Smith et al. |
| 7,346,467 B2 | 3/2008 | Bohrer et al. |
| 7,379,997 B2 | 5/2008 | Ehlers et al. |
| 7,392,115 B2 | 6/2008 | Schindler |
| 7,394,782 B2 | 7/2008 | Davis |
| 7,412,265 B2 | 8/2008 | Chen et al. |
| 7,446,647 B2 | 11/2008 | Helgeson |
| 7,450,926 B2 | 11/2008 | Chang et al. |
| 7,471,942 B2 | 12/2008 | Subramanian et al. |
| 7,604,046 B2 | 10/2009 | Bergman et al. |
| 7,620,409 B2 | 11/2009 | Budampati et al. |
| 7,634,504 B2 | 12/2009 | Amundson |
| 7,636,042 B2 | 12/2009 | Hameed et al. |
| 7,684,408 B2 | 3/2010 | Wakabayashi |
| 7,689,843 B2 | 3/2010 | Hassan et al. |
| 7,693,809 B2 | 4/2010 | Gray |
| 7,706,923 B2 | 4/2010 | Amundson et al. |
| 8,139,623 B2 | 3/2012 | Nielsen et al. |
| 8,170,720 B2 | 5/2012 | Amundson et al. |
| 8,219,251 B2 | 7/2012 | Amundson et al. |
| 8,219,258 B1 | 7/2012 | Amundson et al. |
| 9,157,764 B2 * | 10/2015 | Shetty ............... G01D 4/002 |
| 2001/0029585 A1 | 10/2001 | Simon et al. |
| 2001/0052459 A1 | 12/2001 | Essalik et al. |
| 2002/0011923 A1 | 1/2002 | Cunningham et al. |
| 2002/0022991 A1 | 2/2002 | Sharood et al. |
| 2002/0092779 A1 | 7/2002 | Essalik et al. |
| 2002/0146985 A1 | 10/2002 | Naden |
| 2003/0009265 A1 | 1/2003 | Edwin |
| 2003/0034897 A1 | 2/2003 | Shamoon et al. |
| 2003/0034898 A1 | 2/2003 | Shamoon et al. |
| 2003/0086393 A1 | 5/2003 | Vasudevan et al. |
| 2003/0198280 A1 | 10/2003 | Wang et al. |
| 2004/0117330 A1 | 6/2004 | Ehlers et al. |
| 2005/0060107 A1 | 3/2005 | Rodenberg, III et al. |
| 2005/0171645 A1 | 8/2005 | Oswald et al. |
| 2006/0056322 A1 | 3/2006 | Simpson et al. |
| 2007/0045441 A1 | 1/2007 | Ashworth et al. |
| 2007/0037610 A1 | 2/2007 | Logan |
| 2007/0207841 A1 | 9/2007 | Amerga et al. |
| 2007/0271006 A1 | 11/2007 | Golden et al. |
| 2008/0011864 A1 | 1/2008 | Tessier et al. |
| 2008/0027885 A1 | 1/2008 | Van Putten et al. |
| 2008/0228325 A1 | 9/2008 | Schindler |
| 2008/0238406 A1 | 10/2008 | Banhegyesi |
| 2008/0272934 A1 | 11/2008 | Wang et al. |
| 2008/0277486 A1 | 11/2008 | Seem et al. |
| 2009/0001180 A1 | 1/2009 | Siddaramanna et al. |
| 2009/0001181 A1 | 1/2009 | Siddaramanna et al. |
| 2009/0001182 A1 | 1/2009 | Siddaramanna et al. |
| 2009/0045804 A1 | 2/2009 | Durling et al. |
| 2009/0195349 A1 | 8/2009 | Frader-Thompson et al. |
| 2009/0259346 A1 | 10/2009 | Reed et al. |
| 2009/0312969 A1 | 12/2009 | Sundaresh et al. |
| 2010/0070091 A1 | 3/2010 | Watson et al. |
| 2010/0082174 A1 | 4/2010 | Weaver |
| 2010/0138008 A1 | 6/2010 | Chambers et al. |
| 2010/0287559 A1 | 11/2010 | Mergen et al. |
| 2011/0046805 A1 | 2/2011 | Bedros et al. |
| 2011/0137614 A1 | 6/2011 | Wheeler |
| 2012/0033584 A1 | 2/2012 | Corroy |
| 2012/0092142 A1 | 4/2012 | Patel et al. |
| 2012/0239203 A1 | 9/2012 | Amundson et al. |
| 2013/0030600 A1 | 1/2013 | Shetty et al. |
| 2013/0151012 A1 | 6/2013 | Shetty et al. |
| 2014/0031988 A1 | 1/2014 | Reeder et al. |

FOREIGN PATENT DOCUMENTS

| | | |
|---|---|---|
| DE | 352917 | 2/1987 |
| DE | 19548650 | 6/1997 |
| DE | 4344172 | 10/2006 |
| EP | 0434926 | 7/1991 |
| EP | 0565507 | 10/1993 |
| EP | 0574230 | 12/1993 |
| EP | 0607562 | 7/1994 |
| EP | 0893931 | 1/1999 |
| EP | 0678204 B1 | 3/2000 |

(56) References Cited

FOREIGN PATENT DOCUMENTS

| | | |
|---|---|---|
| EP | 0985994 | 3/2000 |
| EP | 1074009 | 2/2001 |
| EP | 2260563 | 10/2011 |
| FR | 2592977 | 7/1987 |
| GB | 2273593 | 6/1994 |
| SI | 20556 | 10/2001 |
| WO | WO 9307702 | 4/1993 |
| WO | WO 97/11448 | 3/1997 |
| WO | WO 97/39392 | 10/1997 |
| WO | WO 9818225 | 4/1998 |
| WO | WO 00/43870 | 7/2000 |
| WO | WO 0070572 | 11/2000 |
| WO | WO 01/52515 | 7/2001 |
| WO | WO 01/79952 | 10/2001 |
| WO | WO 01/93779 | 12/2001 |

OTHER PUBLICATIONS

Wilhelm Kleiminger, BuildSys'13, Nov. 14-15, 2013, Rome, Italy, 8 pages, Occupancy Detection from Electricity Consumption Data.*
Varick L. Erickson, ACM Transactions on Sensor Networks, vol. 10, No. 3, Article 42, Publication date: Apr. 2014, p. 42-1 to 42-28.*
Hamid R. Khosravani, Energies 2016, 9, 57; doi:10.3390/en9010057, 24 pages.*
A.C. Menezes, 2014 The Authors. Published by Elsevier B.V., p. 199-209.*
Timilehin Labeodan, 2015 The Authors. Published by Elsevier B.V. This is an open access article under the CC BY license, pp. 303-314.*
Mehreen S. Gul, 2014, Understanding the energy consumption and occupancy of a multi-purpose academic building, pp. 155-165.*
Ir. R. Maaijen, REHVA Journal—Aug. 2012, pp. 34-36 in Human centered energy control: taking the occupancy in the control loop of building systems.*
Paloma R. Duong, Spring May 20, 2016, pp. 1-70 in How can occupancy modeling and occupancy sensors reduce energy usage in academic buildings.*
Yuvraj Agarwal, 2010, 6 pages, Occupancy-Driven Energy Management for Smart Building Automation.*
Varick L. Erickson, 2010, 6 pages, Occupancy Based Demand Response HVAC Control Strategy.*
Lu et al., "The Smart Thermostat: Using Occupancy Sensors to Save Energy in Homes," The 8th ACM Conference on Embedded Networked Sensing Systems, pp. 211-224, Zurich, Switzerland, Nov. 2010.
Makonin et al., "Home Occupancy Agent: Occupancy and Sleep Detection," GSTF Journal on Computing, vol. 2, No. 1, pp. 1-5, 2012.
"Image Rejection in Mixers," copyright AAA, 1996.
"A Full Range of Alternative User Interfaces for Building Occupants and Operators," http://www.automatedbuildings.com/news/jan00/articles/andover/andover.htm, 5 pages, dated Jan. 2000, printed Sep. 20, 2004.
"CorAccess Systems/In Home," http://web.archive.org/web20011212084427/www.coraccess.com/home.html, 1 page, copyright 2001, printed Aug. 19, 2004.
"HAI Company Background," http://www.homeauto.com/AboutHAI/abouthai_main.htm, 2 pages, printed Aug. 19, 2004.
"High-Tech Options Take Hold in New Homes-200-08-28-Dallas Business Journal," http://bizjournals.com/dallas/stories/2000/08/28/focus4, 3 pages, dated Aug. 28, 2008, printed Aug. 19, 2004.
"Home Toys Review—TouchLinc," http://www.hometoys.com/htinews/aug99/reviews/touchlinc.htm, 3 pages, dated Aug. 1999, printed Aug. 20, 2004.
"Mark of Excellence Award Finalist Announced," http://64.233.167.104/search?Q=cache:ciOA2YtYaBIJ:www.hometoys.com/releases/mar . . . , 6 pages, Leopard Touchscreen on p. 2, dated prior to Mar. 4, 2000, printed Aug. 20, 2004.
"Medium Access Control (MAC) and Physical (PHY) Specifications," ANSI/IEEE Std 802.11, pp. 177-179, 1999.
"Product Review—Philips Pronto Remote Control," http://hometheaterhifi.com/volume_6_2/philipsprontoremotecontrol.html, 5 pages, dated May 1999, printed Aug. 20, 2004.
"Product Specification for Advanced Pager Receiver UAA2082", Philips, Integrated Circuits, 41 pages, Jan. 15, 1996.
"RC X10 Automation Forum: Control Your Heating and Cooling System with Pronto (1/1)," http://www.remotecentral.com/cgi-bin/mboard/rc-x10/thread.cgi?12, 2 pages, dated Apr. 23, 1999, printed Aug. 20, 2004.
"Spotlight on Integrated Systems," Custom Builder, V8, N2, p. 66(6), Mar.-Apr. 1993.
"Vantage Expands Controls for Audio/Video, HVAC and Security," http://www.Hometoys.com/htinews/aug99/realease/vantage03.htm, 2 pages, dated Aug. 3, 1999, printed Aug. 20, 2004.
"ZigBee Wireless Networking Software," EmberNet ZigBee, 2 pages, prior to Jun. 17, 2005.
Abidi, "Direct-Conversion Radio Transceivers for Digital Communications," IEEE Journal of Solid-State Circuits, vol. 30, No. 12, pp. 1399-1410, Dec. 1995.
Abidi, "Upconversion and Downconversion Mixers for CMOS Wireless Transceivers," copyright AAA, 42 pages, 1996.
ADI, "Leopard User Manual," 93 pages, 2001.
Adicon 2500, "The Automator," 4 pages, Oct.-Dec. 2000.
ADT Security Services, "iCenter Advanced User Interface 8142ADT," Installation and Setup Guide, 5 pages, May 2001; First Sale Feb. 2001.
ADT Security Systems, "iCenter Advanced User Interface 8142ADT User Guide," pp. 1-136, 2001.
Aprilaire Electronic Thremostats Models 8344, 8346, 8348, 8363, 8365, 8366 Operating Instructions, 8 pages, prior to Dec. 2, 2003.
Aube Technologies, Electronic Thermostat for Heating System Model TH135-01, 5 pages, Aug. 14, 2001.
Aube Technologies, TH140-28 Electronic Programmable Thermostat, Installation Instructions and User Guide, pp. 1-4, Jan. 22, 2004.
AutomatedBuildings.com Article—"Thin Client" Solutions, "Pressure, Air Flow, Temperature, Humidity & Valves," Dwyer Instruments, Inc., 5 pages, printed Sep. 20, 2004.
Blake et al., "Seng 310 Final Project Demo Program," Illustration, 3 pages, Apr. 6, 2001.
Blake et al., "Seng 310 Final Project," Report, dated Apr. 6, 2001.
Blister Pack Insert from a Ritetemp 8082 Touch Screen Thermostat Product, 2 pages, 2002.
Braeburn Model 3000 Owner's Manual, pp. 1-13, 2001.
Braeburn Model 5000 Owner's Manual, pp. 1-17, 2001.
BRK Electronics Maximum Protection Plus Ultimate Convenience Smoke Alarm, 24 pages, prior to Dec. 2, 2003.
BRK First Alert, User's Manual, Smoke and Fire Alarms, pp. 1-7, Nov. 2002.
Bryant, "Installation and Start-Up Instructions Evolution Control SYSTXBBUID01," 12 pages, 2004.
Business Wire, "MicroTouch Specialty Products Group to Capitalize on Growing Market for Low-Cost Digital Matrix Touchscreens,"pp. 1174 (2 pages), Jan. 6, 1999.
Cardio Manual, available at http://www.secant.ca/en/documentation/cardio2é-Manual.pdf, Cardio Home Automation Inc., 55 pages, printed Sep. 28, 2004.
Cardio, by Secant; http://www.hometoys.com/htinews/apr98/reviews/cardio.htm, "HTINews Review," Feb. 1998, 5 pages, printed Sep. 14, 2004.
Carrier Microelectronic Programmable Thermostat Owner's Manual, pp. 1-24, May 1994.
Carrier TSTATCCRF01 Programmable Digital Thermostat, pp. 1-21, prior to Dec. 2, 2003.
Carrier, "Programmable Dual Fuel Thermostat," Installation, Start-Up & Operating Instructions, pp. 1-12, Oct. 1998.
Carrier, "Programmable Thermostats," Installation, Start-Up & Operating Instructions, pp. 1-16, Sep. 1998.
Carrier, "Standard Programmable Thermostat," Homeowner's Manual, pp. 1-8, 1998.
Carrier, "Thermidistat Control," Installation, Start-Up, and Operating Instructions, pp. 1-12, Aug. 1999.

(56) References Cited

OTHER PUBLICATIONS

Chang et al., "A CMOS Channel-Select Filter for a Direct-Conversion Wireless Receiver," IEEE Journal of Solid-State Circuits, vol. 32, No. 5, pp. 722-729, May 1997.
Cheng et al., "TPS: A Time-Based Positioning Scheme for Outdoor Wireless Sensor Networks," IEEE INFOCOM 2004, 12 pages, 2004.
Chiasserini et al., "An Analytical Model for Wireless Sensor Networks with Sleeping Nodes," IEEE Transactions on Mobile Computing, vol. 5, No. 12, pp. 1706-1718, Dec. 2006.
Climatouch, User Manual, Climatouch CT03TSB Thermostat, Climatouch CT03TSHB Thermostat with Humididty Control, Outdoor UHF Temperature Transmitter 217S31, 19 pages, Printed Sep. 15, 2004.
File History for ReExam Control No. 95/002,041, U.S. Pat. No. 7,634,504, ReExamination Filed Jul. 18, 2012.
CorAccess, "Companion 6," User Guide, pp. 1-20, Jun. 17, 2002.
Craig, "Zigbee: Wireless Control That Simply Works," 7 pages, prior to Jun. 17, 2005.
Crols et al., "CMOS Wireless Transceiver Design," Kluwer Academic Publishers, 22 pages, 1997.
Danfoss RT51/51 RF & RT52/52RF User Instructions, 2 pages, Jun. 2004.
DeKoven et al., "Designing Collaboration in Consumer Products," 2 pages, 2001.
DeKoven et al., "Measuring Task Models in Designing Intelligent Products," pp. 188-189, 2002.
Domotique Secant Home Automation—Web Page, available at http://www.secant.ca/en/company/default.asp, 1 page, printed Sep. 28, 2004.
Ecobee, "Meet the Ecobee Smart Thermostat," Sales Sheet, 2 pages, prior to Jun. 16, 2009.
Ecobee, Screenshot of Ecobee Web Site Window, Captured prior to Jun. 16, 2009.
Ecobee, Smart Thermostat Installation Manual, pp. 1-26, 2009.
Ecobee, Smart Thermostat User Manual, pp. 1-32, 2009.
Firex Smoke Alarm, Ionization Models AD, ADC Photoelectric Model Pad, 4 pages, prior to Dec. 2, 2003.
Freudenthal et al., "Communicating Extensive Smart Home Functionality to Users of All Ages: The Design of a Mixed-Initiative Multimodal Thermostat-Interface," pp. 34-39, Mar. 12-13, 2001.
Gentex Corporation, 9000 Series, Photoelectric Type Single Station/Multi-Station Smoke Alarms AC Powered with Battery Backup, Installation Instructions—Owner's Information, pp. 9-1 to 9-6, Jan. 1, 1993.
Gentex Corporation, HD135, 135° Fixed Temperature Heat Detector AC Powered, 120V, 60Hz with Battery Backup, Installation Instructions—Owner's Information, pp. 1-5, Jun. 1, 1998.
Honeywell Brivis Deluxe Programmable Thermostat, pp. 1-20, 2002.
Honeywell Brivis T8602C Chronotherm IV Deluxe Programmable Thermostats, Installation Instructions, pp. 1-12, 2002.
Honeywell CT8602C Professional Fuel Saver Thermostat, pp. 1-6, 1995.
Honeywell Electronic Programmable Thermostat, Owner's Guide, pp. 1-20, 2003.
Honeywell Electronic Programmable Thermostats, Installation Instructions, pp. 1-8, 2003.
Honeywell News Release, "Honeywell's New Sysnet Facilities Integration System for Boiler Plant and Combustion Safety Processes," 4 pages, Dec. 15, 1995.
Honeywell T8002 Programmable Thermostat, Installation Instructions, pp. 1-8, 2002.
Honeywell T8602 A, B, C, D and TS8602 A, C Chronotherm III Fuel Saver Thermostats, Installation Instructions, pp. 1-12, 1995.
Honeywell T8602D Chronotherm IV Deluxe Programmable Thermostats, Installation Instructions, pp. 1-12, 2002.
Honeywell TH8000 Series Programmable Thermostats, Owner's Guide, pp. 1-44, 2004.
Honeywell, "Excel Building Supervisor—Integrated R7044 and FS90 Ver. 2.0," Operator Manual, 70 pages, Apr. 1995.
Honeywell, "Introduction of the S7350A Honeywell WebPAD Information Appliance," Home and Building Control Bulletin, 2 pages, Aug. 29, 2000; Picture of Web Pad Device with touch Screen, 1 page; and screen shots of WebPad Device, 4 pages.
Honeywell, "Vision Pro 8000 Touchscreen Programmable Thermostat," Honeywell International Inc., 40 pages, 2004.
Honeywell, "W7006A Home Controller Gateway User Guide," 31 pages, Jul. 2001.
Honeywell, MagicStat® CT3200 Programmable Thermostat, Installation and Programming Instructions, pp. 1-24, 2001.
http://wiki.personaltelco.net/index.cgi/PhasedArray?action=print, "Phased Array—Personal Telco Wiki," 3 pages, May 2, 2005.
http://www.bambooweb.com/articles/o/s/OSI_model.html, "Bambooweb OSI model," Bambooweb Dictionary, 5 pages, printed May 23, 2005.
http://www.cc.gatech.edu/computing_/classes/cs6751_94_fall/groupc/climate-2/node1.html, "Contents," 53 pages, printed Sep. 20, 2004.
http://vvww.dailywireless.org/modules.php?name=News&file=article&sid=871, "Location by Triangulation—Not," Daily Wireless, 2 pages, printed May 2, 2005.
http://www.ecobee.com/productspecifications, "Programmable Thermostats and Other Green Living Products—Specifications," 2 pages, 2009.
http://www.hometoys.com/htinews/apr99/releases/hal01.htm, HTI News Release, pp. 1-3.
http://www.ritetemp.info/rtMenu_13.html, RiteTemp 8082, 6 pages, printed Jun. 20, 2003.
http://www.thermostatsales.com, Robershaw, "9610 Digital Programmable Thermostat," 3 pages, printed Jun. 17, 2004.
http://www.thermostatsales.com, Robershaw, "9700 Digital Programmable Thermostat," 3 pages, printed Jun. 17, 2004.
http://www.thermostatsales.com, Robershaw, "9710 Digital Programmable Thermostat," 3 pages, printed Jun. 17, 2004.
http://www.thermostatsales.com, Robershaw, "9720 Digital Programmable Thermostat," 3 pages, printed Jun. 17, 2004.
http://www.unstrung.com/document.asp?site=unstrung&doc_id15069&page_number=1, 11 pages, printed May 2, 2005.
http://www.zigbee.org/en/about/faq.asp, "Wireless Control That Simply Works," ZigBee Alliance, 8 pages, printed Feb. 2, 2005.
Hunter, "44200/44250," Owner's Manual, 32 pages, printed prior to Dec. 2, 2003.
Hunter, "44300/44350," Owner's Manual, 35 pages, printed prior to Dec. 2, 2003.
Hunter, "Auto Saver 550," Owner's Manual Model 44550, 44 pages, printed prior to Dec. 2, 2003.
Install Guide for Ritetemp Thermostat 8082, 6 pages, 2002.
Invensys Deluxe Programmable Thermostats 9700, 9701, 9715, 9720, User's Manual, 21 pages, prior to Dec. 2, 2003.
Jung et al., "Improving IEEE 802.11 Power Saving Mechanism," 6 pages, Jul. 7, 2004.
Kinney, "ZigBee Technology: Wireless Control That Simply Works," 20 pages, Oct. 2, 2003.
Kleiminger et al., "Occupancy Detection from Electricity Consumption Data," 8 pages, prior to Jul. 27, 2011.
Lee, "The Design of CMOS Radio-Frequency Integrated Circuits," Cambridge University Press, 42 pages, 1998.
Lennox, "Network Control Panel (NCP)," User's Manual, 18 pages, Nov. 1999.
Lux TX9000 Installation, 3 pages, prior to Dec. 2, 2003.
Lux, "511 Series Smart Temp Electronic Thermostat," Owner's Manual, 3 pages, printed prior to Dec. 2, 2003.
Lux, "600 Series Smart Temp Electronic Thermostat," Owner's Manual, 3 pages, printed prior to Dec. 2, 2003.
Lux, "602 Series Multi-Stage Programmable Thermostat," Owner's Manual, 3 pages, printed prior to Dec. 2, 2003.
Lux, "605/2110 Series Programmable Heat Pump Thermostat," Owner's Manual, 3 pages, printed prior to Dec. 2, 2003.
Lux, "700/9000 Series Smart Temp Electronic Thermostat," Owner's Manual, 3 pages, printed prior to Dec. 2, 2003.
Lux, "ELV1 Programmable Line Voltage Thermostat," Owner's Manual, 3 pages, printed prior to Dec. 2, 2003.

(56) References Cited

OTHER PUBLICATIONS

Lux, "PSPH521 Series Programmable Heat Pump Thermostat," Owner's Manual, 3 pages, printed prior to Dec. 2, 2003.
Lux, "TX1500 Series Smart Temp Electronic Thermostat," Owner's Manual, 6 pages, printed prior to Dec. 2, 2003.
Lux, "TX500 Series Smart Temp Electronic Thermostat," Owner's Manual, 3 pages, printed prior to Dec. 2, 2003.
Melfi et al., "Measuring Building Occupancy Using Existing Network Infrastructure," IEEE, 8 pages, 2011.
Metasys, "HVAC PRO for Window's User's Manual," 308 pages, 1998.
Milstein, "Wideband Code Division Multiple Access," IEEE Journal on Selected Areas in Communications, vol. 18, No. 8, pp. 1344-1354, Aug. 2000.
Mounting Template for Ritetemp Thermostat 8082, 1 page, 2002.
Nasipuri et al., "A Directionality Based Location Discovery Scheme for Wireless Sensor Networks," pp. 105-111, prior to Jun. 17, 2005.
Operation manual for Ritetemp Touch Screen Thermostat 8082, 8 pages, 2002.
PCT International Search Report for PCT/US2010/045003 dated Mar. 18, 2011.
Proliphix Inc., "Web Enabled IP Thermostats," 2 pages, prior to Dec. 2, 2003.
Quick Start Guide for Ritetemp Thermostat 8082, 1 page, 2002.
Razavi, "Design Considerations for Direct-Conversion Receivers," IEEE Transactions on Circuits and Systems—II: Analog and Digital Signal Processing, vol. 44, No. 6, pp. 428-435, Jun. 1997.
Remote Control Power Requirement for Ritetemp Thermostat 8082, 1 page, 2002.
Ritetemp Operation 8029, 3 pages, Jun. 19, 2002.
Ritetemp Operation 8050, 5 pages, Jun. 26, 2002.
Ritetemp Operation 8085, pp. 1-6, prior to Dec. 2, 2003.
Rofougaran et al., "A 1 GHz CMOS RF Front-End IC for a Direct-Conversion Wireless Receiver," IEEE Journal of Solid-State Circuits, vol. 31, pp. 880-889, Jul. 1996.
Rofougaran et al. "A 900 MHz CMOS RF Power Amplifier with Programmable Output Power," Proceedings VLSI Circuits Symposium, Honolulu, 4 pages, Jun. 1994.
Savvides et al., "Dynamic Fine-Grained Localization in Ad-Hoc Networks of Sensors," pp. 166-179, prior to Jun. 17, 2005.
Sealed Unit Parts Co., Inc., Supco & CTC Thermostats . . . Loaded with Features, Designed for Value!, 6 pages, prior to Dec. 2, 2003.
Totaline Model P474-1035 Owner's Manual Programmable 5-2 Day Digital Thermostat, pp. 1-21, prior to Dec. 2, 2003.
Totaline Star CPE230RF, Commercial Programmable Thermostat Wireless Transmitter, Owner's Manual, pp. 1-16, Oct. 1998.
Totaline Star P/N P474-0130 Non-Programmable Digital Thermostat Owner's Manual, pp. 1-22, prior to Dec. 2, 2003.
Totaline, "1 for All Programmable Digital Thermostat," Owner's Manual P/N P374-1100FM, 23 pages, Nov. 1998.
Totaline, "1 for All Programmable Digital Thermostat," Owner's Manual P/N P474-1050, 21 pages, Nov. 1998.
Totaline, "1 for All Programmable Digital Thermostat," Owner's Manual P/N P374-1100, 24 pages, Apr. 2001.
Totaline, "Instructions P/N P474-1010," Manual, 2 pages, Dec. 1998.
Totaline, "Intellistat Combination Temperature and Humidity Control," Owner's Manual P/N P374-1600, 25 pages, Jun. 2001.
Totaline, "Programmable Thermostat Configurable for Advanced Heat Pump or Dual Fuel Operation," Owner's Manual P/N P374-1500, 24 pages, Jun. 1999.
Totaline, "Programmable Thermostat," Homeowner's Guide, 27 pages, Dec. 1998.
Totaline, "Wireless Programmable Digital Thermostat," Owner's Manual 474-1100RF, 21 pages, 2000.
Trane, "System Programming, Tracer Summit Version 14, BMTW-SVP01D-EN," 623 pages, 2002.
Trouble Shooting Guide for Ritetemp Thermostat 8082, 1 page, 2002.
Visor Handheld User Guide, Copyright 1999-2000.
Want et al. "The Active Badge Location System," 7 pages, prior to Jun. 17, 2005.
Warmly Yours, "Model TH111GFCI-P (120 VAC)," Manual, pp. 1-4, printed prior to Dec. 2, 2003.
White-Rodgers 1F80-224 Programmable Electronic Digital Thermostat, Installation and Operation Instructions, 8 pages, prior to Dec. 2, 2003.
White-Rodgers Installation Instructions for Heating & Air Conditioning IF78 Non-Programmable Thermostat, 6 pages, prior to Dec. 2, 2003.
White-Rodgers, "Comfort-Set 90 Series Thermostat," Manual, pp. 1-44, printed prior to Dec. 2, 2003.
White-Rodgers, "Comfort-Set III Thermostat," Manual, pp. 1-44, printed prior to Dec. 2, 2003.
White-Rodgers, "Installation Instructions for Heating & Air Conditioning IF72 5/2 Day Programmable Heat Pump Thermostat," 8 pages, printed prior to Dec. 2, 2003.
White-Rodgers, "Installation Instructions for Heating & Air Conditioning IF78 5/2 Day Programmable Thermostat," 7 pages, printed prior to Dec. 2, 2003.
White-Rodgers, Comfort-Set 90 Series Premium, 4 pages, prior to Dec. 2, 2003.
White-Rodgers, IF80-240 "(for Heating Only systems) Programmable Electronic Digital Thermostat," Installation and Operation Instructions, 8 pages, printed prior to Dec. 2, 2003.
White-Rodgers, IF80-241, "Programmable Electronic Digital Thermostat," Installation and Operation Instructions, 6 pages, printed prior to filing date.
White-Rodgers, IF80-261, "Programmable Electronic Digital Thermostat," Installation and Operation Instructions, 8 pages, printed prior to Dec. 2, 2003.
White-Rodgers, IF81-261, "Programmable Electronic Digital Multi-Stage Thermostat," Installation and Operation Instructions, 8 pages, printed prior to Dec. 2, 2003.
White-Rodgers, IF82-261, "Programmable Electronic Digital Heat Pump Thermostat," Installation and Operation Instructions, 8 pages, prior to Dec. 2, 2003.
Wilson et al., "A Single-Chip VHF and UHF Receiver for Radio Paging", IEEE Journal of Solid State Circuits, vol. 26, No. 12, 9 pp. 1944-1950, Dec. 1991.
www.icmcontrols.com, Simplecomfort, SC3000 Single Stage Heat/Single Stage Cool or Single Stage Heat Pump/Manual Changeover, 1 page, printed prior to Dec. 2, 2003.
www.icmcontrols.com, Simplecomfort, SC3001 Single Stage Heat/Single Stage Cool or Single Stage Heat Pump/Manual Changeover, 1 page, printed prior to Dec. 2, 2003.
www.icmcontrols.com, Simplecomfort, SC3006 Single Stage Heat/Single Stage Cool or Single Stage Heat Pump/Manual Changeover, 1 page, printed prior to Dec. 2, 2003.
www.icmcontrols.com, Simplecomfort, SC3201 2 Stage Heat Pump Manual Changeover, 1 page, printed prior to Dec. 2, 2003.
www.icmcontrols.com, Simplecomfort, SC3801 2 Stage Heat/2 Stage Cool 2 Stage Heat Pump/Audio Changeover, 1 page, printed Dec. 2, 2003.

* cited by examiner

DEVICES, METHODS, AND SYSTEMS FOR OCCUPANCY DETECTION

This is a continuation application of U.S. patent application Ser. No. 13/192,096, filed Jul. 27, 2011, and entitled "DEVICES, METHODS, AND SYSTEMS FOR OCCUPANCY DETECTION", which is incorporated herein by reference.

TECHNICAL FIELD

The present disclosure relates to devices, methods, and systems for occupancy detection.

BACKGROUND

Occupancy detection (e.g., determining whether a structure is occupied by one or more individuals) can be an important part of energy management and/or energy cost savings. For example, the energy management settings of an area in a structure (e.g., a room in a house and/or business) can be adjusted based on whether or not an individual(s) is presently located in the area, thereby reducing and/or eliminating the waste of energy resulting from heating and/or cooling unoccupied areas. As an additional example, appliances located in an area can be turned off or energy consumption reduced if an individual is not presently located in the area, thereby reducing and/or eliminating the waste of energy resulting from running appliances while the area is unoccupied.

There are many different approaches for detecting occupancy. For example, cameras and/or motion detectors, such as, for instance, passive infrared (PIR) detectors, can be used as occupancy sensors. However, cameras and motion detectors, as well as other occupancy sensing devices, may be impractical due to high cost and/or complications associated with their installation.

DETAILED DESCRIPTION

Devices, methods, and systems for occupancy detection are described herein. One or more device embodiments include a memory and a processor coupled to the memory. The processor is configured to execute executable instructions stored in the memory to determine energy consumption data associated with a structure at a point in time, and determine whether the structure is occupied at the point in time based, at least in part, on the determined energy consumption data.

Devices, methods, and/or systems for detecting occupancy in accordance with one or more embodiments of the present disclosure can be integrated with a structure's existing power infrastructure, thereby reducing the cost and/or complications associated with their installation. Additionally, embodiments of the present disclosure can determine a predicted occupancy for a structure based on historical energy consumption data for the structure. Embodiments of the present disclosure can receive information from sources outside the structure, including, for example, a GPS location of a user device, to determine whether the structure is occupied, and further, at what time it will or will not be occupied.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of voltage samples" can refer to one or more voltage samples.

Figure 1:
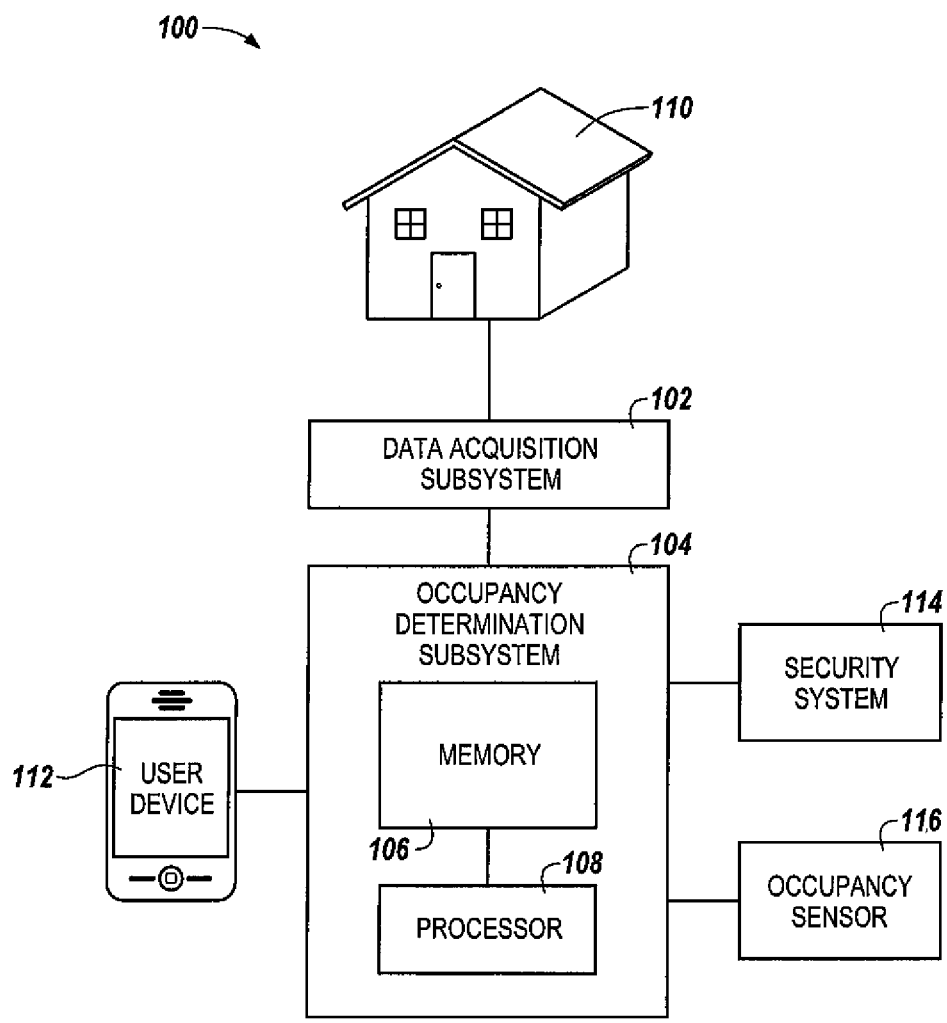
FIG. 1 illustrates a system for occupancy detection in accordance with one or more embodiments of the present disclosure.

FIG. 1 illustrates a system 100 for occupancy detection in accordance with one or more embodiments of the present disclosure. System 100 includes data acquisition subsystem 102 communicatively coupled to structure 110 and occupancy determination subsystem 104. For example, data acquisition subsystem 102 can be linked to structure 110 and/or occupancy determination subsystem 104 via, for example, the Internet or another wired and/or wireless connection.

As shown in FIG. 1, occupancy determination subsystem 104 can be a computing device having a processor and a memory (e.g., processor 108 and memory 106). Memory 106 can be volatile or nonvolatile memory. Memory 106 can also be removable (e.g., portable) memory, or non-removable (e.g., internal) memory. For example, memory 106 can be random access memory (RAM) (e.g., dynamic random access memory (DRAM), and/or phase change random access memory (PCRAM)), read-only memory (ROM) (e.g., electrically erasable programmable read-only memory (EEPROM), and/or compact-disk read-only memory (CD-ROM)), flash memory, a laser disk, a digital versatile disk (DVD), and/or other optical disk storage), and/or a magnetic medium such as magnetic cassettes, tapes, or disks, among other types of memory.

Further, although memory 106 is illustrated as being located in occupancy determination subsystem 104, embodiments of the present disclosure are not so limited. For example, memory 106 can also be located internal to another computing resource (e.g., enabling computer readable instructions to be downloaded over the Internet or another wired or wireless connection and/or network).

Memory 106 can store executable instructions, such as, for example computer readable instructions (e.g., software), for occupancy detection in accordance with one or more embodiments of the present disclosure. Memory can also store date, for example, data used by executable instructions to perform one or more functions or stored for analysis, among other purposes. For example, processor 108 can execute the executable instructions stored in memory 106 to perform one or more of the methods for detecting occupancy further described herein (e.g., in connection with FIG. 2).

Structure 110 can be any structure that can accommodate one or more occupants (e.g., individuals). For example, structure 110 can be a house, an office building, an apartment complex, and/or a hospital, among other types of structures. Structure 110 can also refer to subsets of larger structures. For example, structure 110 can include a room, an office, a wing, a walk-in freezer, and/or a hallway, as well as combinations and/or portions of these examples and/or others. Embodiments of the present disclosure do not limit structure 110 to man-made structures; rather, structure 110 can be any enclosed (e.g., partially enclosed) area that has a capability to accommodate one or more occupants.

In some embodiments, data acquisition subsystem 102 can include a computing device having a processor and a memory in a manner such as in the computing device discussed with reference to occupancy determination subsystem 104. Data acquisition subsystem 102 and occupancy determination subsystem 104 can, in some embodiments be part of the same computing device. Data acquisition subsystem 102 can be utilized to determine (e.g., acquire) energy consumption data associated with a structure (e.g., structure 110) at a point in time. Point in time data can be, for example, one or more periods of time, one or more instants in time, and/or combinations thereof.

Energy consumption data can include, for example, voltage data, current data, frequency data, and/or combinations thereof, including other kinds of data associated with the energy consumption of the structure 110. Data acquisition subsystem 102 can acquire energy consumption data from, for example, an electric service panel of structure 110. For instance, data acquisition subsystem 102 can acquire energy consumption data from a current and/or voltage sensor network, an energy meter, and/or a smart AMI (Advanced Metering Infrastructure) meter, among other power sensing devices, and/or combinations thereof.

To acquire energy consumption data, a current drawn and/or a total load from structure 110 may have to be stepped down, in some instances, into a range suitable for measurement and/or analysis by, for example, occupancy determination subsystem 104. For example, system 100 can include a number of current sensor coils and/or a current transformer which can step down the total current drawn and/or total load.

Data acquisition subsystem 102 can acquire energy consumption data associated with structure 110 at a predetermined time. Additionally and/or alternatively, data acquisition subsystem 102 can acquire additional energy consumption data associated with structure 110 at a predetermined interval and/or at random times.

In some embodiments, data acquisition subsystem 102 can acquire energy consumption data from an electrical supply associated with structure 110. The electrical supply can include, for example, a two phase, three wire system with a 60 Hertz (Hz) frequency and a phase voltage (V) of 120 V, a three phase, four wire, 50 Hz electric distribution system with a phase voltage of 230 V, a single phase 60 Hz system with a phase voltage of 120 V, and/or a single phase, 50 Hz, 230 V power supply. However, embodiments of the present disclosure are not limited to acquiring energy consumption data from the example power supplies listed above; rather, system 100 can acquire energy consumption data from combinations of the example sources listed above, and/or from any suitable source, such as, for example, an electricity provider.

Data acquisition subsystem 102 can acquire the energy consumption data by sampling analog voltage and/or current signals received from a source (e.g., a voltage and current sensor network associated with structure 110) at a desired frequency. Further, data acquisition subsystem 102 can adjust the sampling frequency based on the processing capability (e.g., processing capability of processor 108) of occupancy determination subsystem 104. For example, data acquisition subsystem 102 can acquire a number of voltage and current samples from structure 110 at a predetermined frequency, process the raw samples, and/or modify the sampling rate for communication to the occupancy determination subsystem 104.

Once the energy consumption data has been acquired by the data acquisition subsystem 102, data acquisition subsystem 102 can communicate (e.g., send) the energy consumption data to occupancy determination subsystem 104. That is, occupancy determination subsystem 104 can receive the energy consumption data from data acquisition subsystem 102. From the energy consumption data (e.g., voltage data, current data, frequency data, and/or combinations thereof, including other kinds of data), occupancy determination subsystem 104 can determine additional (e.g., secondary) energy consumption data. Additional energy consumption data can include, by way of example and not limitation, active power, reactive power, apparent power, electrical energy, kilowatt hours (KWh), line frequency, peak current, rate of change of current, harmonic content, peak power, Root Mean Square (RMS) power, and/or combinations thereof, including other additional energy data associated with the energy consumption of structure 110.

Occupancy determination subsystem 104 can determine whether structure 110 is occupied at the point in time based, at least in part, on the energy consumption data. For example, occupancy determination subsystem 104 can determine whether structure 110 is occupied at the point in time based, at least in part, on the energy consumption data acquired by data acquisition subsystem 102 and/or the additional energy consumption data determined by occupancy determination subsystem 104.

As an example, occupancy determination subsystem 104 can determine whether the structure is occupied at the point in time by determining whether a first portion of the energy consumption data meets or exceeds a threshold for the first portion of the energy consumption data. The threshold can, for example, be stored in the memory 106.

Occupancy determination subsystem 104 can determine whether the first portion of the energy consumption data meets or exceeds the threshold by comparing the first portion of the energy consumption data with historical energy consumption data. For example, occupancy determination subsystem 104 can acquire peak current, RMS current and/or rate of change of current, among other energy consumption data, and compare these energy consumption data to historical energy consumption data including, for example, historical peak current, historical RMS current, and/or historical rate of change of current, among others.

If the first portion of the energy consumption data meets or exceeds the threshold, it may exhibit characteristics that indicate occupancy based on the historical data. For example, energy consumption data can include a number of power spikes over a period of time, and system 100 (e.g., occupancy determination subsystem 104) can consider power level as an indicator in determining whether structure 110 is occupied. However, embodiments of the present disclosure do not limit occupancy detection to observation of power levels; rather, as discussed below, a number of systems in structure 110 may affect power level without a correlation to occupancy.

For example, a portion of a number of power spikes for a time period can indicate only that an automated appliance (e.g., a refrigerator and/or a heating system) is turning on or off. An automated appliance turning on or off may not indicate occupancy, because, for example, this behavior can occur in the presence of one or more occupants, or alternatively, in the absence of any occupants. In this regard, occupancy determination subsystem 104 can, for example, consider power levels as an indicator of occupancy, rather than a determining factor.

Additionally, occupancy determination subsystem 104 can use rate of change of power level data (e.g., frequency of power level change) as an indicator of occupancy. For example, in structure 110 without occupant(s), power levels can change (e.g., peak and/or dip) due to, for example, automated system behavior as previously discussed. Conversely, structure 110 having one or more occupants can exhibit a different power signature.

For example, if an occupant is present in structure 110, the occupant can turn lights on and/or off, and/or activate a user-activated appliance, such as, for example, a microwave, a toaster oven, a television set, a radio, etc., among other occupant-initiated activities. Moreover, the occupant can, for example, engage in these powered-level altering activities with a frequency not likely to be equaled in automated system behavior. In this regard, occupancy determination subsystem 104 can, for example, use a rate of change of power level in determining whether structure 110 is occupied.

Occupancy determination subsystem 104 can determine whether the first portion of the energy consumption data meets or exceeds the threshold for the first portion of the energy consumption data by, for example, comparing and/or weighing multiple aspects of energy consumption data. For example, when a Heating, Ventilating, and Air Conditioning (HVAC) system is turned on, it can produce a large change in a power level of a structure. Conversely, an occupant activating a light switch and a television as the occupant enters a room may produce a substantially smaller change in a power level of the structure than the HVAC system.

While the power level change can, for example, be greater for the HVAC system turning on than for the light and the television, the HVAC system may have a lesser determinative effect regarding occupancy than the activation of the light followed shortly thereafter by the activation of the television due to, for example, the difference in frequency of the power level changes. That is, occupancy determination subsystem 104 can compare power level and frequency, among other aspects of energy consumption data, to determine whether the first portion of the energy consumption data meets or exceeds the threshold.

Occupancy determination subsystem 104 can separate a particular aspect of the energy consumption data that may not indicate occupancy (e.g., is not associated with an occupancy state). For example, occupancy determination subsystem 104 can detect (e.g., determine) an energy signature from an HVAC system in normal operation by analyzing, for example, historical data associated with the HVAC system.

Continuing in the example, occupancy determination subsystem 104 can remove the energy signature of the normally-operating HVAC system from the energy consumption data used by occupancy determination subsystem 104 to determine occupancy. Embodiments of the present disclosure do not limit occupancy determination subsystem 104 to removal of HVAC energy consumption data; rather, occupancy determination subsystem 104 can remove (e.g., successively remove) energy consumption data from any source that can be determined (e.g., determined by occupancy determination subsystem 104) to have little and/or no bearing on a determination of occupancy.

Removing aspects of the energy consumption data can allow occupancy determination subsystem 104 to determine occupancy by analyzing aspects of the energy consumption data more likely to indicate occupancy and/or non-occupancy. For example, determining occupancy based on a portion of the energy consumption data associated with an occupancy state (e.g., occupied or not occupied) can allow occupancy determination subsystem 104 to disregard other portions of the energy consumption data that do not indicate occupancy and/or non-occupancy.

Occupancy determination subsystem 104 can receive energy consumption data that has been pre-separated. For example, data acquisition subsystem 102 can be communicatively coupled to multiple energy consumption meters.

An energy consumption meter, as previously discussed, can be associated with (e.g., communicatively coupled to) structure 110. Embodiments of the present disclosure, however, do not limit energy consumption meters to one per structure.

Energy consumption meters can be communicatively coupled to an area (e.g., room) within structure 110, an appliance within structure 110, and/or grouping of appliances within structure 110, among others. For example, an energy consumption meter can be associated with a microwave oven, a spa, a basement, a lamp, a set of lamps, a section of offices, etc. The energy consumption meter(s) associated with structure 110 can communicate energy consumption data of these devices, areas, and/or subsystems to data acquisition subsystem 102 in combination and/or individually.

Data acquisition subsystem 102 can communicate the energy consumption data to occupancy determination subsystem 104, as previously discussed. Communications between structure 110 and occupancy determination subsystem 104 can be associated with one or more identifiers to indicate an origin (e.g., room, appliance, etc.) of the energy consumption data.

Alternatively and/or additionally, occupancy determination subsystem 104 can receive undivided energy consumption data (e.g., not pre-separated) from structure 110. Occupancy determination subsystem 104 can then identify aspects (e.g., portions) of the energy consumption data and selectively remove aspects that do not indicate occupancy and/or non-occupancy.

For example, a spa may have a predictable signature (e.g., frequency) of "off" and "on" modes. Occupancy determination subsystem 104 can determine that this signature is not useful for occupancy detection and can, for example, disregard and/or filter the signature out.

Embodiments of the present disclosure are not limited to using power level and rate of change of power level to determine whether a first portion of the energy consumption data meets or exceeds the threshold for the first portion of the determined energy consumption data. Rather, as previously discussed, other energy consumption data may be considered, including but not limited to: active power, reactive power, apparent power, electrical energy, kilowatt hours (KWh), line frequency, peak current, rate of change of current, harmonic content, peak power, Root Mean Square (RMS) power, and/or combinations of these energy data and/or other energy data.

Occupancy determination subsystem 104 can determine whether the first portion of the energy consumption data meets or exceeds the threshold for the first portion of the energy consumption data using, for example, a short-time- Fourier transform (STFT)-based spectrum estimation to determine a sinusoidal frequency and a phase content of local sections of the power consumption data as it changes over a time period. Alternatively and/or additionally, other methods may be used, including but not limited to: a non-parametric method, an adaptive filtering algorithm, a Kalman filter, a wavelet based time-frequency estimation method, a wavelet transform based method, and/or combinations of these methods and/or other methods.

For example, a wavelet transform based method can include determining a number of distinct wavelet signatures and removing power spikes (e.g., power spikes caused by activation of HVAC system) by the use of, for example, a peak detector. If the first portion of the energy consumption data meets or exceeds the first threshold, occupancy determination subsystem 104 can determine whether a second portion of the energy consumption data meets or exceeds a threshold for the second portion of the energy consumption data. The threshold can be, for example, stored in memory 106.

For example, occupancy determination subsystem 104 can analyze historical energy consumption data along with energy consumption data received from data acquisition subsystem 102 (e.g., energy consumption data newly received from data acquisition subsystem 102). Historical data used to determine whether the second portion of the energy consumption data meets or exceeds the threshold can include, for example, historical data analogous to that previously discussed.

Occupancy determination subsystem 104 can, for example, determine a number of occupancy trends, based at least in part on, for example, a particular time of a day, a particular day of a week, a particular week of a year, a particular season of a year, etc., and/or combinations of these. For instance, an individual may work during the day Monday through Friday, and return to his house (e.g., structure 110) at substantially the same time in the evening (e.g., 6:00 pm).

Occupancy determination subsystem 104 can use this historical data in the determination regarding occupancy detection, among other uses. For example, a small power spike within structure 110 that may not otherwise indicate occupancy may be given more weight if it occurs, for example, at 6:15 pm on a weekday).

As an additional example, the individual may travel during the same week in August each year. Occupancy determination subsystem 104 can, for example, use this historical data to give less weight to energy consumption data indicating occupancy during that week.

As another example, the individual may keep longer hours outside of structure 110 during the summer months, especially on Saturdays. Occupancy determination subsystem 104 can, for example, use this information to give less weight to energy consumption data indicating occupancy at, for example, noon on a July Saturday.

Occupancy determination subsystem 104 can determine that structure 110 is occupied if the second portion for the energy consumption data meets or exceeds the second threshold. Meeting or exceeding the second threshold can include, for example, the determined energy consumption data indicating a threshold-level of any of the examples of the energy consumption data as previously discussed, and/or combinations of these examples and/or other energy consumption data, as previously discussed, with comparison to the historical energy consumption data (e.g., any and/or all of the previously discussed examples of energy consumption data, among others).

Occupancy determination subsystem 104 can determine that structure 110 is not occupied if the second portion for the energy consumption data does not meet or exceed the second threshold with comparison to the historical energy consumption data (e.g., any and/or all of the previously discussed examples of the historical energy consumption data, among others). By comparing historical occupancy and/or energy consumption data stored in the memory (e.g., memory 106), occupancy determination subsystem 104 can, for example, arrive at a final conclusion regarding occupancy within structure 110. Historical energy consumption data combined with data acquired from structure 110 by data acquisition subsystem 102 allows occupancy determination subsystem 104 to detect occupancy, for example, more accurately than by considering historical energy consumption data or energy from data acquisition subsystem 102 (e.g., newly-received energy consumption data) by itself.

In some embodiments, occupancy determination subsystem 104 can determine whether structure 110 is occupied at the point in time based, at least in part, on an input from a user at a security system (e.g., security system 114 shown in FIG. 1) associated with the structure, in addition to and/or in spite of energy consumption data acquired by data acquisition subsystem 102 and/or historical energy consumption data stored in the memory 106. That is, occupancy determination subsystem 104 can receive an input (e.g., feedback) from a user that can include a direct indication of occupancy and/or non-occupancy. For example, if an individual has a security system (e.g., security system 114 shown in FIG. 1) installed in structure 110, the individual can indicate that the structure is not occupied by activating security system 114 by, for example, entering a code.

Further, the user can indicate that the structure is occupied by deactivating the security system by, for example, entering a code. An input into security system 114 can be used by occupancy determination subsystem 104 as a direct indication of occupancy or non-occupancy, and/or can be used in addition to energy consumption data acquired from structure 110 by data acquisition subsystem 102.

Occupancy determination subsystem 104 can determine whether a structure (e.g., structure 110) is occupied at a point in time based, at least in part, on an input from an occupancy sensing device (e.g. occupancy sensor 116 shown in FIG. 1), and/or a number of occupancy sensing devices working alone or in combination. Occupancy sensing devices, can be used in conjunction with energy consumption data acquired by data acquisition subsystem 102, and include many possible devices, such as, for example, acoustic devices, cameras, infrared (IR) sensing devices, carbon dioxide ($CO_2$) detectors, etc.

Figure 2:
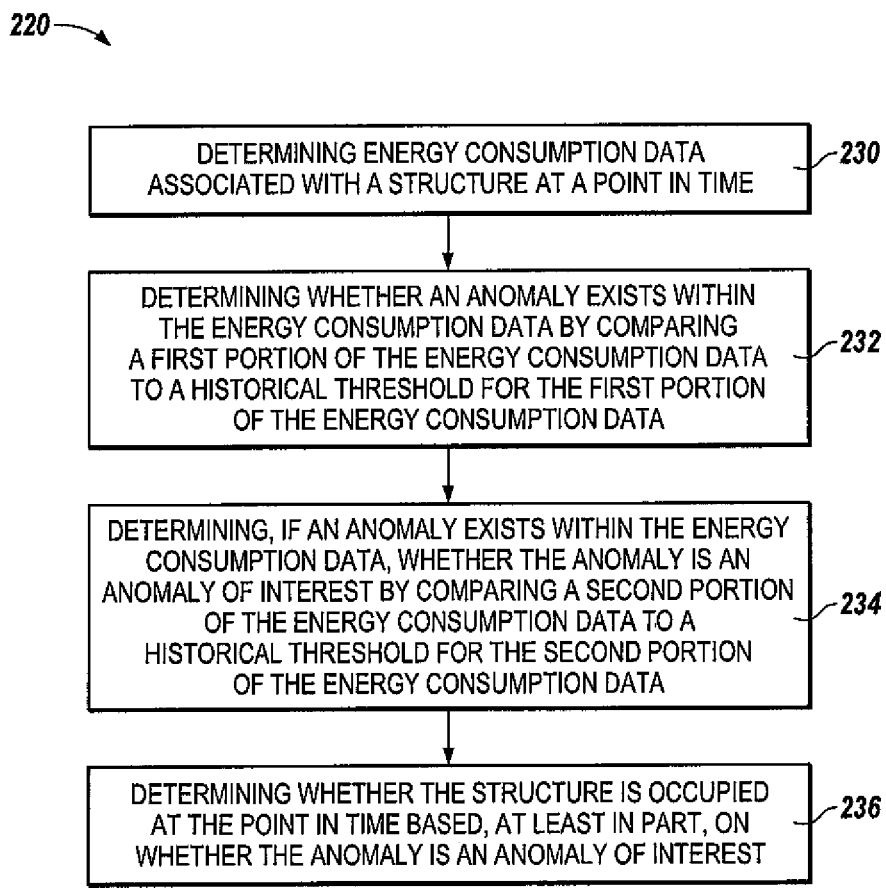
FIG. 2 illustrates a method for occupancy detection in accordance with one or more embodiments of the present disclosure.

Although shown as separated in FIG. 2, security system 114 and occupancy sensor 116 can be included within the same system and/or computing device. For example, security system 114 can include occupancy sensor 116.

If a structure 110 is determined to be occupied, system 100 (e.g., occupancy determination subsystem 104) can send a communication to a user device 112. User device 112 can be, for example, a computing device and/or a mobile device (e.g., a cellular telephone and/or a personal digital assistant (PDA)), among other devices. Communications sent to user device 112 can, for example, indicate that occupancy has been determined within structure 110. As an example, a user may seek heightened security for structure 110 and may be interested in being notified if structure 110 is occupied.

Occupancy determination subsystem 104 can send, for example, an email, a text message, a voice message, and/or a social media message, among other types of electronic communications, to inform the user about the occupancy status of structure 110. Upon receiving such a message, the user can then input, via user device 112, a verification and/or command to occupancy determination subsystem 104.

For example, if the user is out of the country and receives a text message informing the user that structure 110 is determined to be occupied, the user can, for example, make a determination that structure 110 should not be occupied. The user can then inform occupancy determination subsystem 104, via user device 112, about an unauthorized occupancy of structure 110. Additionally and/or alternatively, the user can notify security system 114 directly and/or via occupancy determination subsystem 104.

Embodiments of the present disclosure do not limit communications sent by occupancy determination subsystem 104 to user device 112 only to instances where occupancy is detected. Rather, a communication can be sent by occupancy determination subsystem 104 to user device 112 in a number of scenarios, including, for example, upon a determination that structure 110 is not occupied.

If structure 110 is determined to be occupied, system 100 (e.g., occupancy determination subsystem 104) can send a communication to a programmable thermostat. Communications between a programmable thermostat and system 100 are not limited to situations where a structure (e.g., structure 110) is deemed to be occupied; rather, system 100 and/or occupancy determination subsystem 104 can send communications to a programmable thermostat in cases where a structure (e.g., structure 110) is not occupied.

Sending a communication to a programmable thermostat can include, for example, a communication to activate or deactivate an HVAC system, and/or to adjust a number of set points of the programmable thermostat. For example, if structure 110 is determined to not be occupied, occupancy determination subsystem 104 can send that determination to a programmable thermostat which can then, for example, adjust heating and/or cooling settings for the structure 110 (e.g., a portion of structure 110 controlled by the programmable thermostat).

One or more embodiments according to the present disclosure can allow occupancy determination subsystem 104 to predict a number of behaviors, including, for example, a return time of a user to structure 110. For example, user device 112 can be equipped with Global Positioning System (GPS) technology through which occupancy determination subsystem 104 can receive a location of user device 112.

The location of a user device 112 can be used by occupancy determination subsystem 104 to determine occupancy. For instance, if a user typically leaves work on a weekday at approximately 5:30 pm and drives directly to structure 110, occupancy determination subsystem 104 can compare a GPS location of the user (e.g., the user carrying user device 112) with a detected occupancy state within structure 110. Occupancy determination subsystem 104 can, for example, use this comparison to predict a return time of the user to structure 110, and can additionally, for example, make a more accurate determination regarding occupancy and/or non-occupancy at a point in time.

Occupancy determination subsystem 104 can use additional methods to make a prediction regarding a determination of occupancy. For example, user device 112 can have an electronic calendar associated with it. A user of user device 112 can use the calendar to program the user's schedule (e.g., meeting times, and/or locations, among other schedule data).

Occupancy determination subsystem 104 can use this calendar data to determine an occupancy state within structure 110. For example, if a user has a meeting at a particular time at a location not within structure 110, occupancy determination subsystem 104 can use this data to determine whether an occupant is present in structure 110.

FIG. 2 illustrates a method 220 for occupancy detection in accordance with one or more embodiments of the present disclosure. Method 220 can be performed, for example, by system 100 (e.g., occupancy determination subsystem 104) previously described in connection with FIG. 1 to determine whether a structure is occupied at a point in time based, at least in part, on energy consumption data associated with the structure.

At block 230, method 220 includes determining energy consumption data associated with a structure (e.g., structure 110 previously described in connection with FIG. 1) at a point in time. Energy consumption data can include, for example, energy consumption data analogous to that previously discussed in connection with FIG. 1. A point in time and structure can include, for example, a point in time and structure analogous to those previously discussed in connection with FIG. 1.

At block 232, method 220 includes determining whether an anomaly exists within the energy consumption data by comparing a first portion of the energy consumption data to a historical threshold for the first portion of the energy consumption data if the first portion of the energy consumption data meets or exceeds the historical threshold. An anomaly exists within the energy consumption data if the first portion of the energy consumption data meets or exceeds the historical threshold. Comparing a first portion of the energy consumption data to a historical threshold for the first portion for the energy consumption data can be analogous to the determination of whether a first portion of the determined energy consumption data meets or exceeds a threshold for the first portion of the determined energy consumption data stored in the memory in a manner analogous to that previously discussed in connection with FIG. 1.

At block 234, method 220 includes determining, if an anomaly exists within the energy consumption data, whether the anomaly is an anomaly of interest by comparing a second portion of the energy consumption data to a historical threshold for the second portion of the energy consumption data. The anomaly is an anomaly of interest if the second portion of the energy consumption data meets or exceeds the historical threshold for the second portion of the energy consumption data. Determining whether the anomaly is an anomaly of interest can be analogous to the determination of whether a second portion of determined energy consumption data meets or exceeds a threshold for the second portion of the determined energy consumption data previously discussed in connection with FIG. 1.

At block 236, method 220 includes determining whether the structure (e.g., structure 110) is occupied at the point in time based, at least in part, on whether the anomaly is an anomaly of interest. The structure is occupied at the point in time if the anomaly is an anomaly of interest, and the structure is not occupied at the point in time if the anomaly is not an anomaly of interest. Determining whether the structure is occupied at the point in time based, at least in part, on whether the anomaly is an anomaly of interest can be analogous to the determination of whether the structure is occupied at the point in time based, at least in part, on determined (e.g., acquired) energy consumption data previously discussed in connection with FIG. 1.

Although not shown in FIG. 2, method 220 can include determining whether structure 110 is occupied at the point in time based, at least in part, on feedback received from a user in a manner analogous to that previously discussed in connection with FIG. 1, on GPS data associated with a user in a manner analogous to that previously discussed in connection with FIG. 1, and/or on a particular day of a week, on a particular season of a year and/or combinations thereof and/or other time indicators in a manner analogous to that previously discussed in connection with FIG. 1.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An HVAC controller for controlling an HVAC system of a structure, the HVAC controller comprising:
    a memory storing executable instructions that, when executed, compare energy consumption data to one or more historical energy consumption thresholds to determine an occupancy status of the structure, and when the occupancy status is indicated as being occupied, adjust an HVAC setting to a comfort value, and when the occupancy status is indicated as being unoccupied, adjust the HVAC setting to an energy savings value;
    a controller coupled to the memory, wherein the controller is configured to execute the executable instructions stored in the memory to:
    obtain energy consumption data associated with the structure;
    determine the occupancy status of the structure by comparing the energy consumption data to the one or more historical energy consumption thresholds stored in the memory;
    when the determined occupancy status is indicated as being occupied, adjust the HVAC setting of the HVAC system servicing the structure to the comfort value;
    when the determined occupancy status is indicated as being unoccupied, adjust the HVAC setting of the HVAC system servicing the structure to the energy savings value; and
    thermostatically control the HVAC system servicing the structure in accordance with the comfort value when the adjusted HVAC setting is set to the comfort value, and thermostatically control the HVAC system in accordance with the energy savings value when the adjusted HVAC setting is set to the energy savings setting.

2. The HVAC controller of claim 1, wherein the HVAC setting comprises a heating setting.

3. The HVAC controller of claim 1, wherein the HVAC setting comprises a cooling setting.

4. The HVAC controller of claim 1, wherein the controller is further configured to report the occupancy status to a security system that services the building.

5. The HVAC controller of claim 1, wherein the controller is further configured to report the occupancy status to another device.

6. The HVAC controller of claim 1, wherein the controller is further configured to report the occupancy status to a user device via an electronic message.

7. The HVAC controller of claim 1, wherein the controller is configured to determine the occupancy status of the structure based, at least in part, on feedback received from a user.

8. The HVAC controller of claim 1, wherein the controller is configured to determine the occupancy status of the structure based, at least in part, on GPS data associated with a user.

9. The HVAC controller of claim 1, wherein the GPS data associated with the user comprises:
    a GPS location of the user; and
    a predicted return time of the user to the structure determined based at least in part on the GPS location of the user.

10. The HVAC controller of claim 1, wherein the controller is configured to determine the occupancy status of the structure based, at least in part, on a particular day of a week.

11. The HVAC controller of claim 1, wherein the controller is configured to determine the occupancy status of the structure based, at least in part, on a particular season of a year.

12. The HVAC controller of claim 1, wherein the comparison of the energy consumption data to the one or more historical energy consumption thresholds comprises comparing a first portion of the energy consumption data to a historical threshold for the first portion of the energy consumption data, and when the first portion of the energy consumption data meets or exceeds the historical threshold for the first portion of the energy consumption data, comparing a second portion of the energy consumption data to a historical threshold for the second portion of the energy consumption data.

13. The HVAC controller of claim 6, wherein the electronic message is one or more of an email message, a text message, a voice message, and a social media message.

14. The HVAC controller of claim 12, wherein:
    the first portion of the energy consumption data comprises one or more of a peak current, an RMS current, a rate of change of current, and a frequency of power level changes; and
    the historical threshold for the first portion comprises one or more of a corresponding historical peak current, a historical RMS current, a historical rate of change of current, and a historical frequency of power level changes.

15. The HVAC controller of claim 12, wherein the controller is configured to determine when the first portion of the energy consumption data meets or exceeds the historical threshold for the first portion of the energy consumption data via one or more of: (1) short-time-Fourier transform (STFT)-based spectrum estimation to determine a sinusoidal frequency and a phase content of local sections of the energy consumption data as it changes over a time period; (2) a non-parametric algorithm; (3) an adaptive filtering algorithm; (4) a Kalman filter; (5) a wavelet based time-frequency estimation algorithm; and (6) a wavelet transform based algorithm.

16. The HVAC controller of claim 12, wherein the controller is configured to determine when the second portion of the energy consumption data meets or exceeds the historical threshold for the second portion of the energy consumption data using one or more of: (1) short-time-Fourier transform (STFT)-based spectrum estimation to determine a sinusoidal frequency and a phase content of local sections of the energy consumption data as it changes over a time period; (2) a non-parametric algorithm; (3) an adaptive filtering algorithm; (4) a Kalman filter; (5) a wavelet based time-frequency estimation algorithm; and (6) a wavelet transform based algorithm.

* * * * *